United States Patent
Oshikawa

(10) Patent No.: US 12,130,565 B2
(45) Date of Patent: Oct. 29, 2024

(54) CIRCUIT BOARD UNIT, ATTACHMENT UNIT, AND IMAGE FORMING APPARATUS

(71) Applicant: Yuki Oshikawa, Kanagawa (JP)

(72) Inventor: Yuki Oshikawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 401 days.

(21) Appl. No.: 17/476,479

(22) Filed: Sep. 16, 2021

(65) Prior Publication Data
US 2022/0088950 A1 Mar. 24, 2022

(30) Foreign Application Priority Data
Sep. 23, 2020 (JP) ................. 2020-158508

(51) Int. Cl.
*G03G 15/08* (2006.01)
*G03G 21/16* (2006.01)
(Continued)

(52) U.S. Cl.
CPC ..... *G03G 15/0863* (2013.01); *G03G 21/1652* (2013.01); *G03G 21/1867* (2013.01); *G03G 21/1885* (2013.01); *H01R 12/52* (2013.01); *H01R 12/712* (2013.01); *H01R 12/716* (2013.01); *H05K 5/0069* (2013.01);
(Continued)

(58) Field of Classification Search
CPC .............. G03G 15/0863; G03G 15/80; G03G 21/1652; G03G 21/1867; G03G 21/1871; G03G 21/1878; G03G 21/1885; G03G 2215/0695; G03G 2215/0697; G03G 2221/166; G03G 2221/1823; H05K 5/0069; H05K 2201/09754; H05K 2201/10257;
(Continued)

(56) References Cited

U.S. PATENT DOCUMENTS 6,857,906 B2* 2/2005 Bricaud ............... H01R 12/714
439/630
7,462,040 B1* 12/2008 Takada ................. H01R 13/193
439/76.1
(Continued)

FOREIGN PATENT DOCUMENTS

CN 1802777 A 7/2006
CN 101138133 A 3/2008
(Continued)

OTHER PUBLICATIONS

Chinese Office Action issued Dec. 11, 2023, in corresponding Chinese Patent Application No. 202111080023.4, 9 pages.

*Primary Examiner* — Robert B Beatty
(74) *Attorney, Agent, or Firm* — XSENSUS LLP

(57) ABSTRACT

A circuit board unit includes a circuit board, and a relay. The circuit board includes an exposed terminal. The relay contacts the exposed terminal in a conductive manner. The relay includes a first contact and a second contact. The first contact contacts the exposed terminal. The second contact is disposed at a position away from the first contact and contacts and separates from a terminal of an apparatus in conjunction with attachment and detachment of the circuit board unit to and from a body of the apparatus. The relay relays conduction between the exposed terminal and the terminal that contacts the second contact.

19 Claims, 9 Drawing Sheets

(51) Int. Cl.
*G03G 21/18* (2006.01)
*H01R 12/00* (2006.01)
*H01R 12/52* (2011.01)
*H01R 12/71* (2011.01)
*H05K 5/00* (2006.01)
*H01R 13/70* (2006.01)

(52) U.S. Cl.
CPC ....... *G03G 2221/166* (2013.01); *H01R 13/70* (2013.01); *H01R 2201/06* (2013.01)

(58) Field of Classification Search
CPC .. H01R 12/712; H01R 12/714; H01R 12/716; H01R 12/52; H01R 12/523
USPC ...................................................... 399/12, 90
See application file for complete search history.

(56) References Cited

U.S. PATENT DOCUMENTS

| | | | | |
|---|---|---|---|---|
| 2004/0203261 | A1* | 10/2004 | DeFord | H01R 13/2435 |
| | | | | 439/66 |
| 2011/0139504 | A1 | 6/2011 | Ambo et al. | |
| 2011/0243579 | A1 | 10/2011 | Oshikawa et al. | |
| 2014/0029973 | A1 | 1/2014 | Terazawa et al. | |
| 2015/0079814 | A1 | 3/2015 | Tamai | |
| 2015/0118890 | A1 | 4/2015 | Oshikawa | |
| 2018/0070799 | A1 | 3/2018 | Sekido | |
| 2019/0109396 | A1* | 4/2019 | Shimba | H01R 13/112 |
| 2019/0319383 | A1* | 10/2019 | Okuyama | H01R 12/716 |
| 2021/0280999 | A1* | 9/2021 | Horii | H01R 12/7005 |
| 2022/0095459 | A1* | 3/2022 | Oshikawa | H05K 1/142 |

FOREIGN PATENT DOCUMENTS

| | | | | |
|---|---|---|---|---|
| CN | 102113183 A | | 6/2011 | |
| CN | 102667640 A | | 9/2012 | |
| CN | 104466581 A | | 3/2015 | |
| CN | 107613838 A | | 1/2018 | |
| JP | 11214089 A | * | 8/1999 | ............ H01R 12/57 |
| JP | 2007-199505 | | 8/2007 | |
| JP | 2007199505 A | * | 8/2007 | |
| JP | 2009-069417 | | 4/2009 | |
| WO | 2006/095724 A1 | | 9/2006 | |
| WO | 2011/155642 A1 | | 12/2011 | |

* cited by examiner

CIRCUIT BOARD UNIT, ATTACHMENT UNIT, AND IMAGE FORMING APPARATUS

CROSS-REFERENCE TO RELATED APPLICATION

This patent application is based on and claims priority pursuant to 35 U.S.C. § 119(a) to Japanese Patent Application No. 2020-158508, filed on Sep. 23, 2020 in the Japan Patent Office, the entire disclosure of which is hereby incorporated by reference herein.

BACKGROUND

Technical Field

Embodiments of the present disclosure relate to a circuit board unit on which a circuit board such as an integrated circuit (IC) chip is mounted, an attachment unit such as a toner-container including the circuit board unit, and an image forming apparatus such as a copier, a printer, a facsimile machine, or a multifunction peripheral or a printing machine thereof.

Description of the Related Art

There has been widely known an image forming apparatus such as a copying machine in which attachment units such as toner cartridges are detachably or replaceably mounted. More specifically, each of such toner cartridges (attachment units) includes an IC-chip such as the circuit board storing information related to the toner cartridge. When the toner cartridge is mounted on the body of the image forming apparatus, the IC chip of the toner cartridge and terminals of the body of the image forming apparatus contact each other so as to communicate with each other, and information can be exchanged between toner cartridge and the image forming apparatus.

SUMMARY

In an aspect of the present disclosure, a circuit board unit includes a circuit board, and a relay. The circuit board includes an exposed terminal. The relay contacts the exposed terminal in a conductive manner. The relay includes a first contact and a second contact. The first contact contacts the exposed terminal. The second contact is disposed at a position away from the first contact and contacts and separates from a terminal of an apparatus in conjunction with attachment and detachment of the circuit board unit to and from a body of the apparatus. The relay relays conduction between the exposed terminal and the terminal that contacts the second contact.

In another aspect of the present disclosure, an attachment unit includes a circuit board, a relay, and a holder. The circuit board includes an exposed terminal. The relay contacts the exposed terminal in a conductive manner. The holder holds the circuit board and the relay in a state in which a first contact of the relay is in contact with the exposed terminal. The relay includes a second contact at a position away from the first contact. The second contact contacts and separates from a terminal of an apparatus in conjunction with attachment and detachment of the attachment unit to and from the apparatus. The relay relays conduction between the exposed terminal and the terminal that contacts the second contact.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
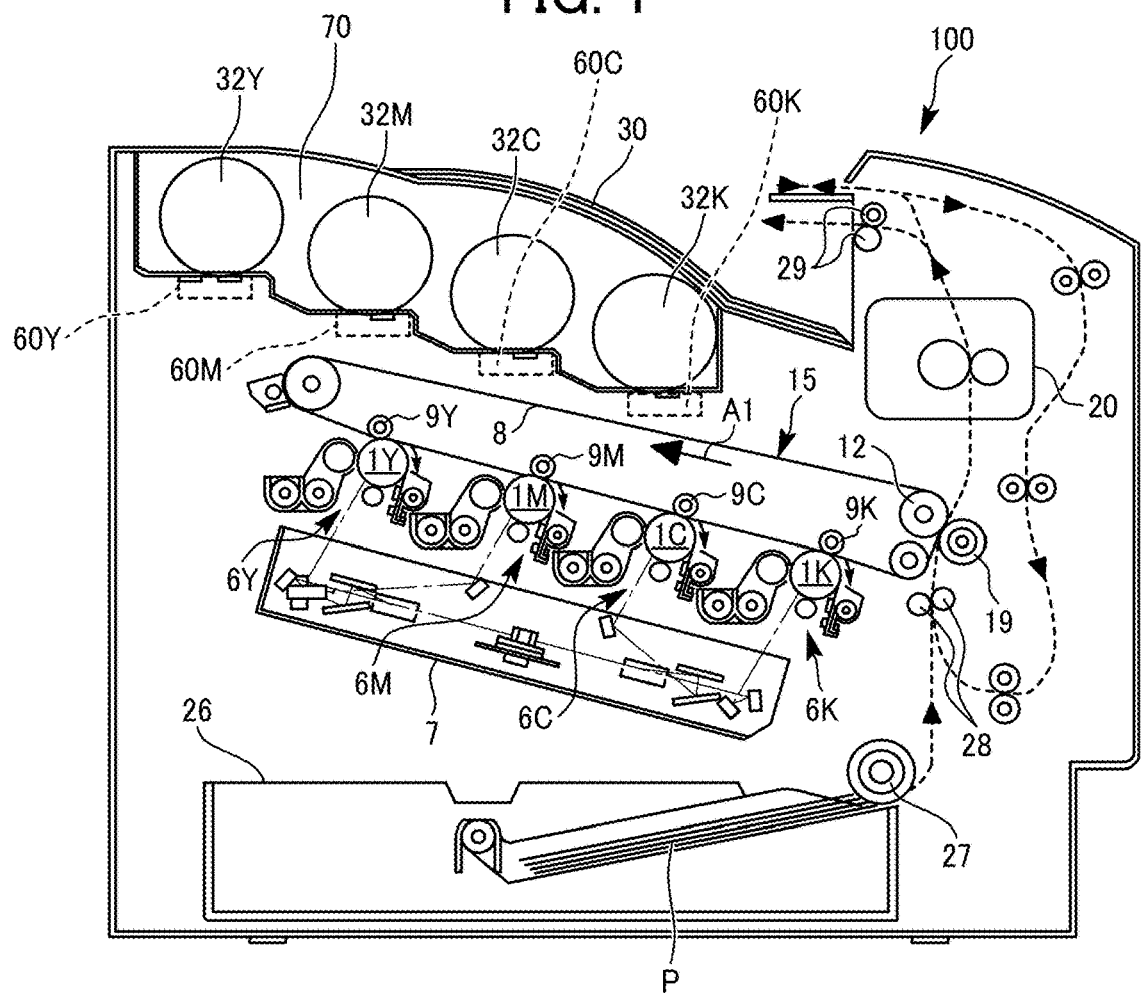
FIG. 1 is a schematic diagram illustrating an overall configuration of an image forming apparatus according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, embodiments of the present disclosure are described in detail with reference to the drawings. In the drawings, the same or corresponding portions are denoted by the same reference numerals, and redundant descriptions thereof are appropriately simplified or omitted.

First, an overall configuration and operation of an image forming apparatus 100 is described.

FIG. 1 is a schematic diagram illustrating an overall configuration of the image forming apparatus 100 according to the present embodiment.

Figure 3:
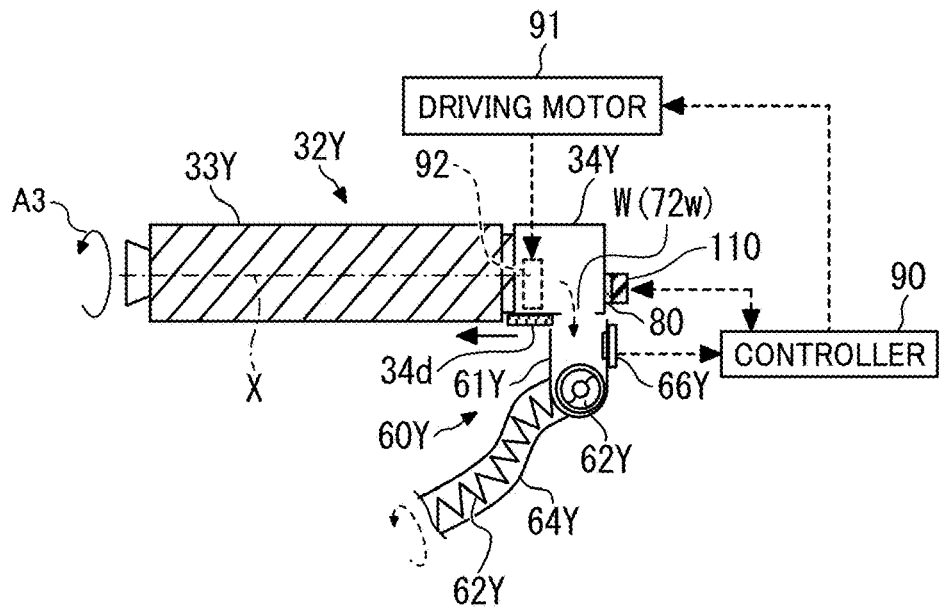
FIG. 3 is a schematic diagram of a toner container mounted on a toner supply device, according to an embodiment of the present disclosure.

FIG. 3 is a schematic diagram of a toner container mounted on a toner supply device.

As illustrated in FIGS. 1 and 3, toner containers 32Y, 32M, 32C, and 32K as four attachment units corresponding to the colors of yellow, magenta, cyan, and black, respectively are detachably and replaceably mounted on a toner container mount 70 in an upper portion of the image forming apparatus 100.

An intermediate transfer unit 15 is disposed below the toner container mount 70. Image forming devices 6Y, 6M, 6C, and 6K that correspond to toner images of yellow, magenta, cyan, and black, respectively, are arranged side by side, facing an intermediate transfer belt 8 of the intermediate transfer unit 15.

Toner supply devices 60Y, 60M, 60C, and 60K are provided below the toner containers 32Y, 32M, 32C, and 32K, respectively. Toner stored in the toner containers 32Y, 32M, 32C, and 32K is supplied into each corresponding one of developing units of the image forming devices 6Y, 6M, 6C, and 6K, respectively, by the toner supply devices 60Y, 60M, 60C, and 60K, respectively.

Figure 2:
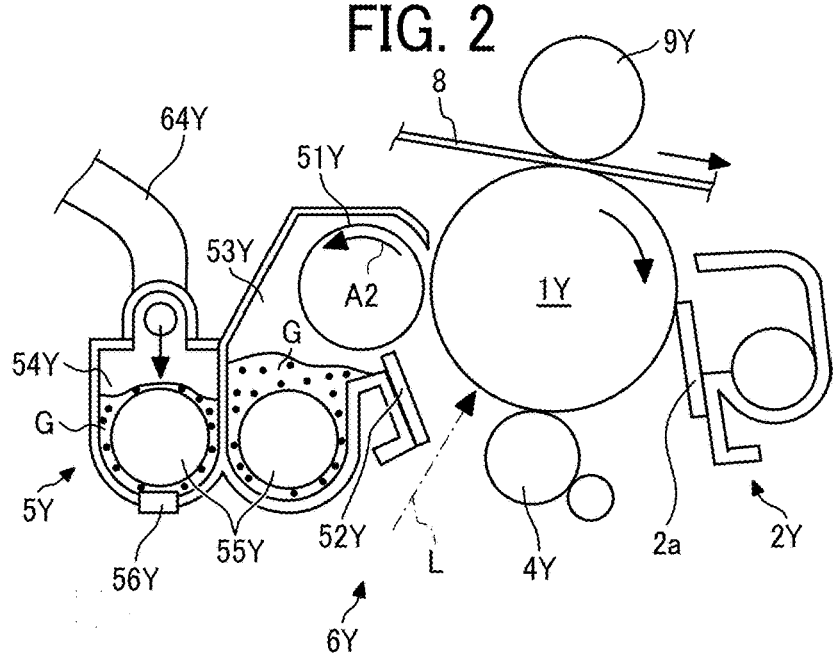
FIG. 2 is a schematic cross-sectional view of an image forming device of an image forming apparatus, according to an embodiment of the present disclosure.

FIG. 2 is a schematic cross-sectional view of the image forming device 6Y of the image forming apparatus 100, according to the present embodiment.

As illustrated in FIG. 2, the image forming device 6Y corresponding to yellow includes a photoconductor drum 1Y as an image bearer, a charger 4Y, a developing device 5Y, a cleaner 2Y, and a discharger. The charger 4Y, the developing device 5Y, the cleaner 2Y, and the discharger are provided around the photoconductor drum 1Y. An image forming process that includes a charging step, an exposure step, a developing step, a transfer step, a cleaning step, and a discharging step, is performed on the photoconductor drum 1Y. Thus, a yellow toner image is formed on the surface of the photoconductor drum 1Y.

The other three image forming devices 6M, 6C, and 6K have substantially the same configuration as that of the image forming device 6Y corresponding to yellow except that the colors of toners to be used are different, and images corresponding to the respective toner colors are formed. Thus, only the image forming device 6Y corresponding to yellow is described below and descriptions of the other three image forming devices 6M, 6C, and 6K are omitted.

As illustrated in FIG. 2, the photoconductor drum 1Y is driven to rotate clockwise in FIG. 2 by a motor. The charger 4Y uniformly charges the surface of the photoconductor drum 1Y as the charging step.

When the surface of the photoconductor drum 1Y reaches a position at which the surface of the photoconductor drum 1Y is irradiated with a laser beam L emitted from an exposure device 7 (see FIG. 1), the photoconductor drum 1Y is scanned with the laser beam L. Thus, an electrostatic latent image for yellow is formed on the photoconductor drum 1Y as the exposure step.

Then, the surface of the photoconductor drum 1Y reaches a position opposite the developing device 5Y, at which the electrostatic latent image is developed into a yellow toner image as the development step.

When the surface of the photoconductor drum 1Y carrying the yellow toner image reaches a position opposite a primary transfer roller 9Y via the intermediate transfer belt 8, the yellow toner image on the photoconductor drum 1Y is transferred onto the intermediate transfer belt 8 as the primary transfer step. After the primary transfer step, a certain amount of untransferred toner remains on the photoconductor drum 1Y.

When the surface of the photoconductor drum 1Y reaches a position opposite the cleaner 2Y, a cleaning blade 2a of the cleaner 2Y mechanically collects the untransferred toner on the photoconductor drum 1Y as the cleaning step.

Finally, the surface of the photoconductor drum 1Y reaches a position opposite a discharger, and the discharger removes residual potentials from the photoconductor drum 1Y to complete a sequence of the image forming process performed on the photoconductor drum 1Y.

The image forming process described above is also performed in the other image forming devices 6M, 6C, and 6K similarly to the image forming device 6Y for yellow. In other words, the exposure device 7 disposed below the image forming devices 6M, 6C, and 6K irradiates photoconductor drums 1M, 1C, and 1K of the image forming devices 6M, 6C, and 6K, respectively, with the laser beams L based on image data.

Then, toner images of each color formed on the photoconductor drums 1Y, 1M, 1C, and 1K through the development step are transferred and superimposed onto the intermediate transfer belt 8. Thus, a color toner image is formed on the intermediate transfer belt 8.

In the present embodiment, as illustrated in FIG. 1, the intermediate transfer unit 15 includes, for example, the intermediate transfer belt 8, four primary transfer rollers 9Y, 9M, 9C, and 9K, a secondary-transfer backup roller 12, a plurality of tension rollers, and an intermediate transfer cleaner. The intermediate transfer belt 8 is stretched around and supported by the multiple rollers and is rotated by one of the multiple rollers that serves as a drive roller rotates, i.e., the secondary-transfer backup roller 12 in a direction indicated by arrow A1 illustrated in FIG. 1.

The four primary transfer rollers 9Y, 9M, 9C, and 9K are pressed against the photoconductor drums 1Y, 1M, 1C, and 1K, respectively, via the intermediate transfer belt 8 to form primary transfer nips. A primary-transfer bias opposite in polarity to toner is applied to the primary transfer rollers 9Y, 9M, 9C, and 9K.

While rotating in the direction indicated by arrow A1 in FIG. 1, the intermediate transfer belt 8 passes through the primary transfer nips between the photoconductor drums 1Y, 1M, 1C, and 1K and the respective four primary transfer rollers 9Y, 9M, 9C, and 9K. Then, single-color toner images on the photoconductor drums 1Y, 1M, 1C, and 1K are primarily transferred to and superimposed on the intermediate transfer belt 8.

Subsequently, the intermediate transfer belt 8 on which the toner images of yellow, cyan, magenta, and black are superimposed reaches a position opposite the secondary transfer roller 19. At this position, the secondary-transfer backup roller 12 and the secondary transfer roller 19 press against each other via the intermediate transfer belt 8 to form a secondary transfer nip. The toner images of yellow, cyan, magenta, and black formed on the intermediate transfer belt 8 are transferred onto a sheet P such as a sheet of paper conveyed to the secondary transfer nip. At this time, untransferred toner that has not been transferred onto the sheet P remains on the surface of the intermediate transfer belt 8.

The surface of the intermediate transfer belt 8 then reaches a position opposite the intermediate transfer cleaner, and the untransferred toner is collected from the intermediate transfer belt 8 at the position to complete a series of the image transfer process performed on the intermediate transfer belt 8.

In the present embodiment, the sheet P conveyed to the position of the secondary transfer nip is conveyed from a sheet feeder 26 disposed in a lower portion of the body of the image forming apparatus 100 via a sheet feeding roller 27, a registration roller pair 28, and the like.

Specifically, the sheet feeder 26 contains a stack of multiple sheets P such as sheets of paper stacked on another. The sheet feeding roller 27 rotates counterclockwise in FIG. 1 to feed a top sheet P from the stacked sheets P toward a roller nip between the registration roller pair 28.

The sheet P stops moving temporarily at the roller nip of the registration roller pair 28 which stops rotating. Then, the registration roller pair 28 rotates to transport the sheet P toward the secondary transfer nip in synchronization with the arrival of the color toner image on the intermediate transfer belt 8. Thus, a desired color image is transferred onto the sheet P.

Subsequently, the sheet P, onto which the color image has been transferred at the secondary transfer nip, is conveyed to a fixing device 20. At this position, the color image transferred onto the front surface of the sheet P is fixed onto the sheet P by heat and pressure from a fixing roller and a pressure roller.

Subsequently, the sheet P passes through between an output roller pair 29 and is ejected to the outside of the image forming apparatus 100. The sheets P ejected by the output roller pair 29 are sequentially stacked as output documents on a stacking tray 30.

Thus, a series of the image forming process performed by the image forming apparatus 100 is completed.

Next, the configuration and operation of the developing device 5Y in the image forming device 6Y is described in further detail with reference to FIG. 2.

The developing device 5Y includes a developing roller 51Y disposed opposite the photoconductor drum 1Y, a doctor blade 52Y disposed opposite the developing roller 51Y, two conveying screws 55Y disposed in developer containers 53Y and 54Y, and a toner concentration sensor 56Y to detect concentration of toner in developer G. The developing roller 51Y includes, for example, stationary magnets therein, a sleeve that rotates around the magnets. The developer containers 53Y and 54Y contain the two-component developer G including carrier and toner. The developer container 54Y communicates with a toner conveyance pipe 64Y as a toner conveyance path via an opening formed above the developer container 54Y.

The developing device 5Y as described above operates as follows.

The sleeve of the developing roller 51Y rotates in a direction indicated by an arrow in FIG. 2. The developer G is carried on the developing roller 51Y by a magnetic field generated by the magnets. As the sleeve rotates, the developer G moves along the circumference of the developing roller 51Y.

In the present embodiment, the percentage or concentration of toner in the developer G, i.e., the ratio of toner to carrier in the developing device 5Y is constantly adjusted within a predetermined range. More specifically, as toner in the developing device 5Y is consumed, toner as the developer stored in the toner container 32Y is supplied into the toner supply device 60Y (see, for example, FIGS. 3 and 5) via the developer container 54Y. The configuration and operation of the toner supply device 60Y will be described in detail later.

The two conveying screws 55Y stir and mix the developer G with toner supplied into the developer container 54Y while circulating the developer G in the developer containers 53Y and 54Y. In this case, the developer G moves in the direction perpendicular to the surface of the paper on which FIG. 2 is drawn. The toner in developer G is triboelectrically charged by friction with the carrier and electrostatically attracted to the carrier. Then, the toner is carried on the developing roller 51Y together with the carrier by magnetic force generated on the developing roller 51Y.

The developer G carried on the developing roller 51Y is conveyed in the direction indicated by arrow A2 illustrated in FIG. 2 to the doctor blade 52Y. The amount of developer G on the developing roller 51Y is adjusted at the position of the doctor blade 52Y. Then, the developer G is conveyed to a development range opposite the photoconductor drum 1Y. The toner in the developer G is attracted to the latent image formed on the photoconductor drum 1Y due to the effect of an electric field generated in the development range. As the sleeve rotates, the developer G remaining on the developing roller 51Y reaches an upper part of the developer container 53Y and separates from the developing roller 51Y at the position.

Next, the toner supply devices 60Y, 60M, 60C, and 60K are described in detail with reference to, for example, FIGS. 3, 4, and 5.

As illustrated in, for example, FIG. 3, toner as the developer is stored in each of the toner containers 32Y, 32M, 32C, and 32K mounted on the toner container mount 70 in the body of the image forming apparatus 100. Then, toner is appropriately supplied into each of the developing devices 5Y, 5M, 5C, and 5K by the toner supply devices 60Y, 60M, 60C, and 60K, respectively, provided for each toner color in accordance with toner consumption in the developing device of each color.

The four toner supply devices 60Y, 60M, 60C, and 60K or the toner containers 32Y, 32M, 32C, and 32K have substantially the same structure except that the colors of the toners used in the image forming process are different. Thus, only the toner supply device 60Y and the toner container 32Y for yellow is described, and the description of the toner supply devices 60M, 60C, and 60K corresponding to the other three colors, and the toner containers 32M, 32C, and 32K corresponding to the other three colors is appropriately omitted.

Figure 4:
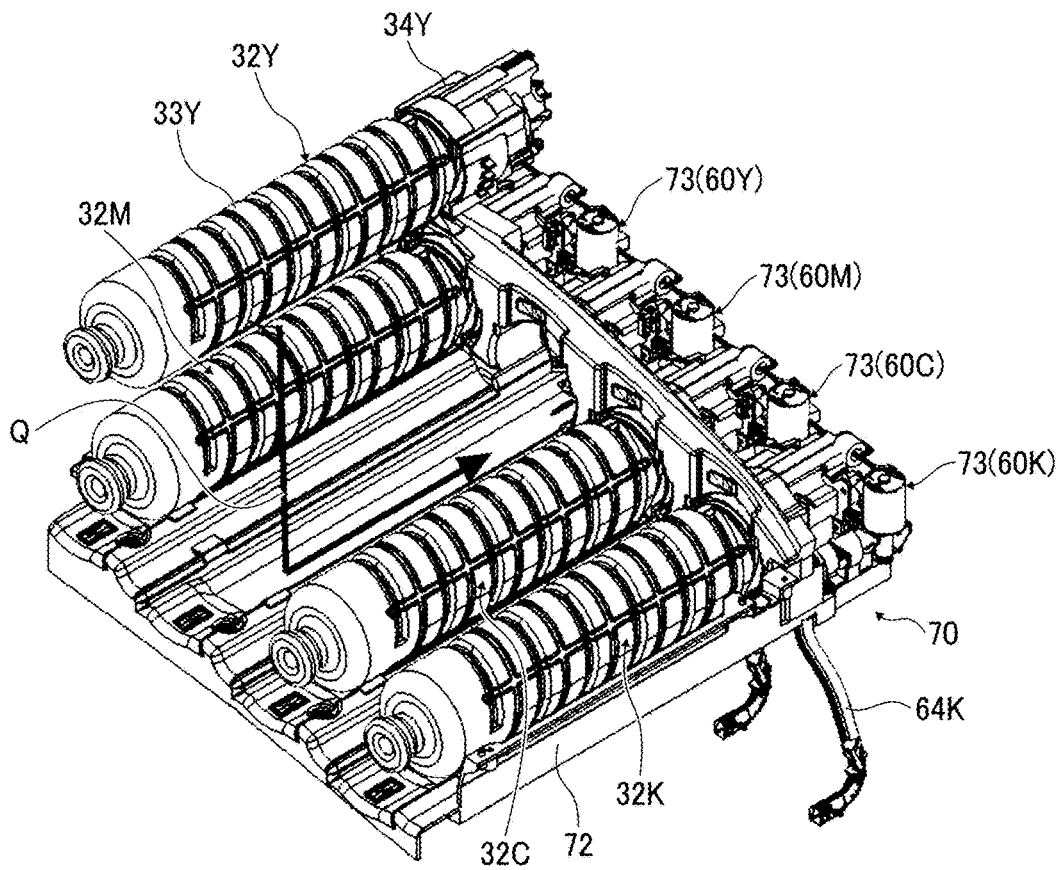
FIG. 4 is a perspective view of toner containers mounted on a toner container mount, according to an embodiment of the present disclosure.

FIG. 4 is a perspective view of the toner containers 32Y, 32M, 32C, and 32K mounted on the toner container mount 70, according to the present embodiment.

As illustrated in FIG. 4, when the toner containers 32Y, 32M, 32C, and 32K are moved along arrow Q to be mounted on the toner container mount 70 in the body of the image forming apparatus 100, shutters 34d (see FIG. 3) of the toner containers 32Y, 32M, 32C, and 32K move in conjunction with the mounting operation of the toner containers 32Y, 32M, 32C, and 32K to open toner discharge ports W of the toner supply devices 60Y, 60M, 60C, and 60K of the toner container mount 70 and the toner supply ports 72W (see FIG. 3) are communicated with each other. Accordingly, toner contained in the toner containers 32Y, 32M, 32C, and 32K is discharged from the toner discharge ports W, and is stored in a toner tank 61Y via the toner supply ports 72W of the toner supply devices 60Y, 60M, 60C, and 60K of the toner container mount 70.

Figure 6:
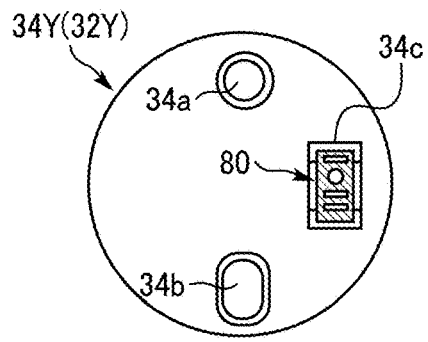
FIG. 6 is a front view of a cap of a toner container, according to an embodiment of the present disclosure.

As illustrated in, for example, FIGS. 3 and 6, when the toner container 32Y is inserted into the image forming apparatus 100, the circuit board unit 80 installed on the cap 34Y of the toner container 32Y is connected to a terminal unit 110 (see FIG. 7) of the image forming apparatus 100 in conjunction with the mounting operation of the toner container 32Y. Thus, information can be exchanged between the circuit board 81 as an IC chip, of the circuit board unit 80 and the controller 90 of the image forming apparatus 100. Then, based on the information acquired from the circuit board 81, the controller 90 displays the amount of toner remaining in the toner container 32Y on an operation display panel, which is mounted on the exterior of the body of the image forming apparatus 100, determines the timing of toner replenishment from the toner container 32Y to the developing device 5Y, and executes a recovery operation from toner end state.

Figure 5:
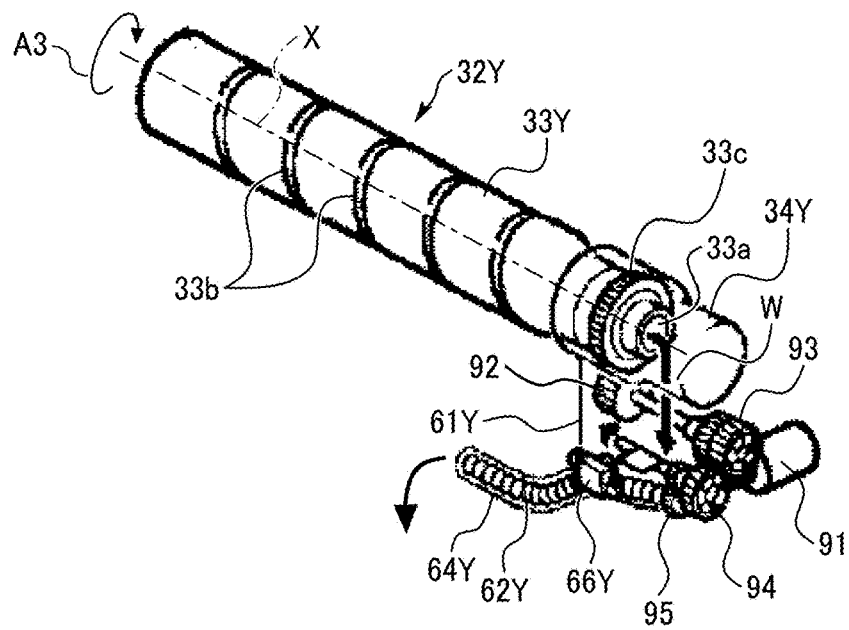
FIG. 5 is a perspective view of a toner container and a relevant part of a toner supply device according to an embodiment of the present disclosure.

FIG. 5 is a perspective view of the toner container 32Y and a relevant part of the toner supply device 60Y according to the present embodiment.

In the present embodiment, as illustrated in, for example, FIGS. 3 and 5, the toner container 32Y as the attachment unit such as the toner containers 32Y, 32M, 32C, and 32K is a substantially cylindrical toner bottle. The toner container 32Y mainly includes the cap 34Y held by the toner container mount 70 in a non-rotatable manner and a toner bottle 33Y as a toner bottle integrally formed with a gear 33c.

The toner bottle 33Y is held so as to be rotatable relative to the cap 34Y and rotationally driven in the direction indicated by arrow A3 in FIGS. 3 and 5 by a drive mechanism which includes, for example, a driving motor 91, gears 92 and 93. The toner bottle 33Y itself is rotated about an axial line X such that toner contained in the toner bottle 33Y of the toner container 32Y is conveyed by projections 33b (see FIG. 5) formed in a spiral shape on an inside wall surface (inner peripheral surface) of the toner bottle 33Y in an axial direction, i.e., a longitudinal direction (from left to right in FIG. 3). Accordingly, toner is discharged from an opening 33a of the toner bottle 33Y to the cap 34Y and further discharged from the toner discharge port W of the cap 34Y outside of the toner container 32Y. In other words, the toner bottle 33Y of the toner container 32Y is appropriately driven to rotate by the driving motor 91. Accordingly, toner is appropriately supplied to the toner tank 61Y. Each of the toner containers 32Y, 32M, 32C, and 32K is replaced with a new one when each of the toner containers 32Y, 32M, 32C, and 32K reaches the end of the operational life, i.e., when almost all of toner contained in the toner containers 32Y, 32M, 32C, or 32K is consumed and the corresponding toner container is empty.

FIG. 6 is a front view of the cap 34Y of the toner container 32Y, according to the present embodiment.

As illustrated such as in FIG. 6, the circuit board unit 80 is fitted to and installed on an installation portion 34C formed on an end surface of the cap 34Y.

Figure 8A:
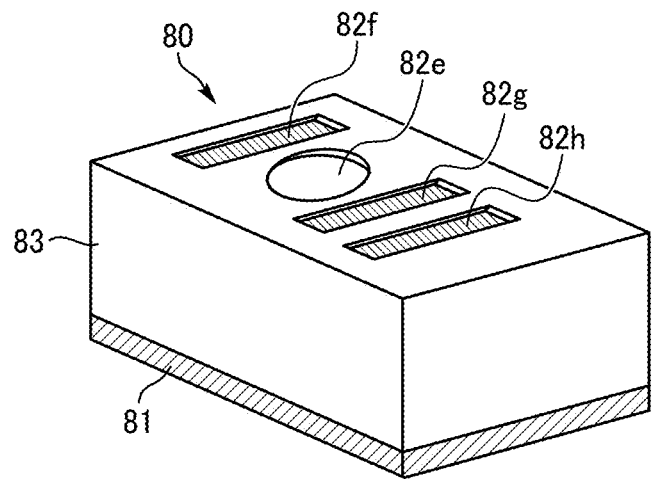
FIG. 8A is a perspective view of a circuit board unit including a casing and a circuit board, according to an embodiment of the present disclosure.

FIG. 8A is a perspective view of the circuit board unit 80 including a casing 83 and the circuit board 81, according to the present embodiment.

Figure 8B:
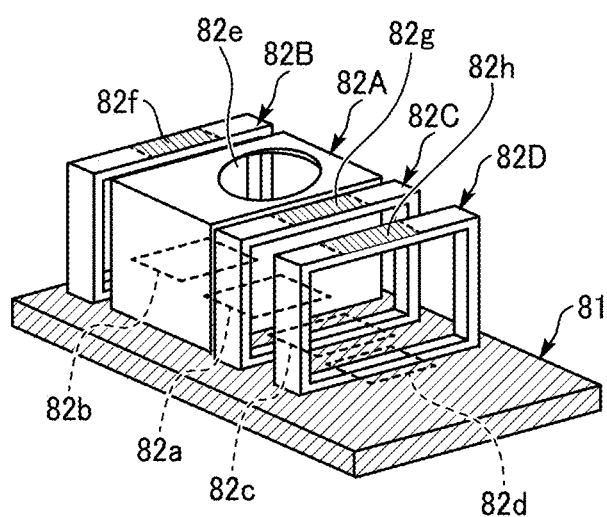
FIG. 8B is a perspective view of the circuit board unit from which the casing is removed, according to an embodiment of the present disclosure.

FIG. 8B is a perspective view of the circuit board unit 80 from which the casing 83 is removed, according to the present embodiment.

The circuit board 81 (see, for example, FIGS. 8A and 8B) as an information storage device is installed on the circuit board unit 80. The circuit board 81 is, for example, an IC chip and exchanges various information with the controller 90 of the image forming apparatus 100. More specifically, the circuit board 81 stores in advance information such as the manufacturing date, the production lot number, the color, and the type of the toner bottle 33Y contained in the toner container 32Y and information such as the manufacturing date, the destination, the manufacturing factory, and the recyclability of the toner container 32Y itself. The above-described pieces of information are sent to the controller 90 of the image forming apparatus 100. Further, information such as a use history in the image forming apparatus 100 is also transmitted from the controller 90 provided for the image forming apparatus 100 to the circuit board 81 as the IC chip. Thus, the information is appropriately stored in the circuit board 81.

The configuration and operation of the circuit board unit 80 in which the above-described circuit board 81 is installed will be described in detail later.

Figure 7:
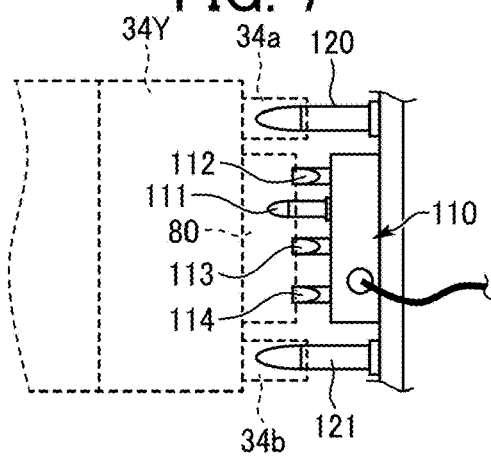
FIG. 7 is a view of terminals provided for a body of an image forming apparatus, according to an embodiment of the present disclosure.

FIG. 7 is a view of terminals 111, 112, 113, and 114 projecting from the image forming apparatus 100, according to the present embodiment.

As illustrated in FIG. 6, positioning holes 34a and 34b are formed on the end surface of the cap 34Y to determine the position of the cap 34Y in the toner container mount 70 of the image forming apparatus 100.

When the toner container 32Y is mounted on the body of the image forming apparatus 100, the positioning holes 34a and 34b formed on the cap 34Y of the toner container 32Y are fitted to positioning pins 120 and 121 (see FIG. 7) projecting from the body of the image forming apparatus 100 in conjunction with the mounting operation of the toner container 32Y. Accordingly, the position of the cap 34Y in the toner container mount 70 and in the body of the image forming apparatus 100 is determined. Then, the circuit board unit 80 is normally connected to the terminal unit 110 (see FIG. 7) of the image forming apparatus 100 via the cap 34Y positioned as described above.

As illustrated in FIGS. 3 and 5, each of the toner supply devices 60Y, 60M, 60C, and 60K includes, for example, the toner container mount 70, a toner tank 61Y, a conveying coil 62Y, a toner end sensor 66Y, a driving motor 91, and gears 92, 93, 94, and 95.

The toner tank 61Y is disposed below the toner discharge port W of the toner container 32Y, and stores toner discharged from the toner discharge port W of the toner container 32Y. A bottom portion of the toner tank 61Y is connected to an upstream portion of the toner conveyance pipe 64Y.

The toner end sensor 66Y is disposed on a side wall of the toner tank 61Y at a predetermined height from the bottom of the side wall and detects that the amount of toner stored in the toner tank 61Y has fallen to equal to or less than a predetermined amount. For example, a piezoelectric sensor can be used as the toner end sensor 66Y. Then, when the controller 90 detects that the amount of toner stored in the toner tank 61Y is equal to or less than a predetermined amount by the toner end sensor 66Y as a toner end detection, the controller 90 controls the driving motor 91 to rotationally drive the toner bottle 33Y of the toner container 32Y for a predetermined time to supply toner to the toner tank 61Y. Further, in a case in which the toner end detection by the toner end sensor 66Y is not released even if such control is repeated, it is determined that there is no toner in the toner container 32Y, and a message for prompting replacement of the toner container 32Y is displayed on the operation display panel installed on an exterior portion of the image forming apparatus 100.

As illustrated in FIGS. 3 and 5, the conveying coil 62Y is provided inside the toner conveyance pipe 64Y so as to rotate, and conveys toner stored in the toner tank 61Y toward the developing device 5Y via the toner conveyance pipe 64Y. More specifically, the conveying coil 62Y is rotationally driven by the driving motor 91 to convey toner from the bottom portion, which is a lowermost portion, of the toner tank 61Y toward an upper portion of the developing device 5Y along the toner conveyance pipe 64Y. Then, toner conveyed by the conveying coil 62Y is supplied into the developer container 54Y of the developing device 5Y.

In the present embodiment, the driving source of the conveying coil 62Y is commonly shared as the driving source of the toner bottle 33Y and of the toner container 32Y. In other words, when the driving motor 91 is rotationally driven, the toner container 32Y rotates and the conveying coil 62Y also rotates.

As illustrated in FIG. 4, the toner container mount 70 mainly includes a cap holder 73 for holding the cap 34Y of the toner container 32Y, a bottle holder 72 for holding the toner bottle 33Y of the toner container 32Y, and the terminal unit 110 (see FIGS. 3 and 7). The terminal unit 110 includes a plurality of the terminals 111, 112, 113, and 114.

In the present embodiment, as illustrated in FIG. 1, when a body cover disposed above a front side of the image forming apparatus 100, which is the front side in the direction perpendicular to the sheet surface of FIG. 1, is opened, the toner container mount 70 is exposed. In a state in which the axial directions, i.e., longitudinal directions of the toner containers 32Y, 32M, 32C, and 32K, are horizontal, the operation to mount and detach the toner containers 32Y, 32M, 32C, and 32K on and from the image forming apparatus 100 from above the front side of the image forming apparatus 100 is performed, which is an attachment and detachment operation of the toner containers 32Y, 32M, 32C, and 32K in the longitudinal directions of toner containers 32Y, 32M, 32C, and 32K.

More specifically, when the toner containers 32Y, 32M, 32C, and 32K are mounted on the body of the image forming apparatus 100, the toner containers 32Y, 32M, 32C, and 32K are placed on the toner container mount 70 from above the body of the image forming apparatus 100 with the body cover opened. Then, each of the toner containers 32Y, 32M, 32C, and 32K is pushed horizontally and moved along arrow Q in FIG. 4 with the corresponding one of the caps 34Y at the top. By contrast, when the toner containers 32Y, 32M, 32C, and 32K are detached from the body of the image forming apparatus 100, the operations are performed in reverse to the operations when the toner containers 32Y, 32M, 32C, and 32K are mounted.

Hereinafter, the configuration and operation of the circuit board unit 80 installed in each of the toner containers 32Y, 32M, 32C, 32K as the attachment unit according to the present embodiment are described.

As described above with reference to, for example, FIGS. 3, 6, and 7, each of the toner containers 32Y, 32M, 32C, and 32K in which toner is stored serves as the attachment unit that is detachably mounted in the body of the image forming apparatus 100. The circuit board unit 80 on which the circuit board 81, which is an IC-chip in the present embodiment, is installed, is mounted on the cap 34Y of each of the toner containers 32Y, 32M, 32C, 32K as the attachment unit. Thus, the circuit board unit 80 can communicate with the controller 90 of the image forming apparatus 100.

Figure 9A:
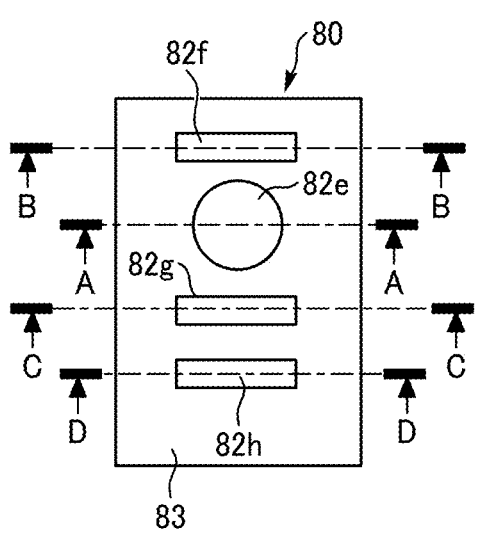
FIG. 9A is a top view of a circuit board unit according to an embodiment of the present disclosure.

FIG. 9A is a top view of the circuit board unit 80 according to the present embodiment.

The circuit board unit 80 is detachably installed in a predetermined direction, i.e., the left-right direction in FIG. 3A and the direction perpendicular to the paper surface of FIG. 9A with respect to the image forming apparatus 100.

As illustrated in FIGS. 8A, 8B, 9A, 9B, and 9C, the circuit board unit 80 typically includes, for example, the circuit board 81 as the IC chip, relays 82A, 82B, 82C, 82D, and the casing 83.

Figure 9B:
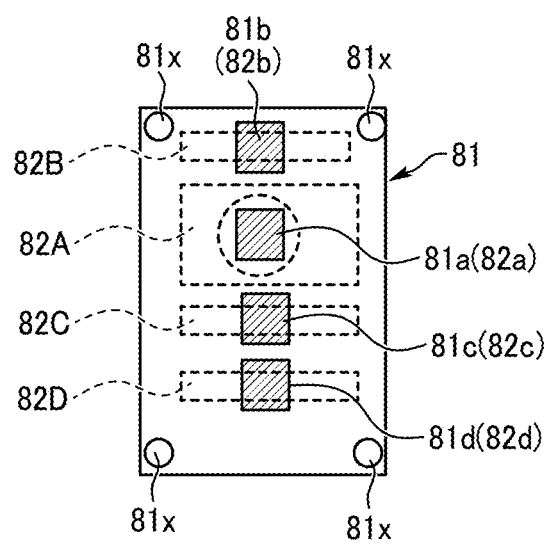
FIG. 9B is a top view of a circuit board of a circuit board unit, according to an embodiment of the present disclosure.

FIG. 9B is a top view of the circuit board 81 according to the present embodiment.

Figure 9C:
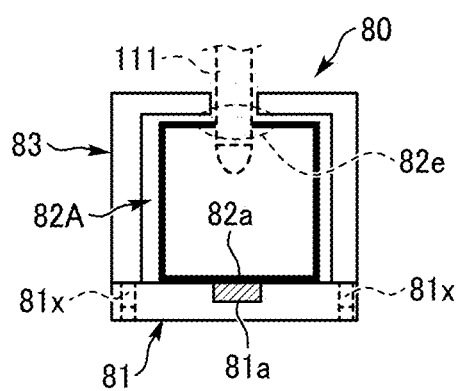
FIG. 9C is an A-A cross-sectional view of a circuit board unit of FIG. 9A, according to an embodiment of the present disclosure.

FIG. 9C is an A-A cross-sectional view of the circuit board unit 80 of FIG. 9A according to the present embodiment.

Figure 9D:
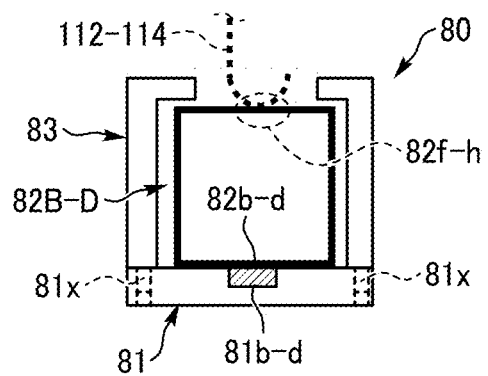
FIG. 9D is a B-B sectional view, a C-C sectional view, or a D-D sectional view of a circuit board unit of FIG. 9A, according to an embodiment of the present disclosure.

FIG. 9D is a B-B sectional view, a C-C sectional view, or a D-D sectional view of the circuit board unit 80 of FIG. 9A, according to the present embodiment.

As illustrated in, for example, FIGS. 8A, 8B, 9B, 9C, and 9D, the circuit board 81 is disposed as a single unit so that terminals 81a, 81b, 81c, and 81d are exposed.

In particular, in the present embodiment, an IC chip as an information storage device provided with an information storage unit capable of communicating information with the image forming apparatus 100 is used as the circuit board 81.

In the present embodiment, the circuit board 81 includes a plurality of terminals 81a, 81b, 81c, and 81d as four terminals. To be more specific, as viewed from above in FIG. 9B, the four terminals including the terminal 81b for clock signal, the terminal 81a for grounding, the terminal 81c for serial-data communication, and the terminal 81d for power-supply are arranged side by side at intervals from each other. The terminal 81b for clock signal is a terminal that receives a clock signal for aligning the transmission and reception timings in the circuit board 81. The terminal 81*a* for grounding is a terminal that grounds the base portion of the circuit board 81 via the image forming apparatus 100. The terminal 81*c* for serial-data communication is a terminal that performs serial-data communications with the image forming apparatus 100. The terminal 81*d* for power supply is a terminal for supplying power from the image forming apparatus 100 to operate the circuit board 81.

The surfaces of the circuit board 81 are covered with an insulating material, such as, non-conductive material, except for the portions on which the four terminals 81*a*, 81*b*, 81*c*, and 81*d* are exposed.

The relays 82A, 82B, 82C, and 82D conductively contacts the terminals 81*a*, 81*b*, 81*c*, and 81*d* of the circuit board 81, respectively.

In particular, in the present embodiment, as illustrated in FIG. 8B and FIGS. 9B, 9C, and 9D, four relays 82A, 82B, 82C, and 82D that contact the terminals 81*a*, 81*b*, 81*c*, and 81*d*, respectively, in a conductive manner are provided at intervals so as not to contact a neighboring one of the other terminals.

Each of the relays 82A, 82B, 82C, and 82D is a bent plate spring made of a metallic material. In particular, in the present embodiment, each of the relays 82A, 82B, 82C, and 82D is formed in an approximately rectangular shape like a rectangular ring. The relays 82A, 82B, 82C, and 82D include first contacts 82*a*, 82*b*, 82*c*, and 82*d*, respectively, and include second contacts 82*e*, 82*f*, 82*g*, and 82*h*, respectively.

As described above, the relays 82A, 82B, 82C, and 82D that are approximately rectangular shaped are bent flat plate springs, and a part of the rectangular-shaped relays 82A, 82B, 82C, and 82D may have an opening, and a pair of the rectangular-shaped relays 82A, 82B, 82C, and 82D may have a space therebetween.

The first contacts 82*a*, 82*b*, 82*c*, and 82*d* contact the terminals 81*a*, 81*b*, 81*c*, and 81*d* of the circuit board 81, respectively.

The second contacts 82*e*, 82*f*, 82*g*, and 82*h* are provided at positions away from the first contacts 82*a*, 82*b*, 82*c*, and 82*d*, respectively, with respect to a predetermined direction which is the attachment and detachment direction of the toner containers 32Y including the circuit board unit 80 and the direction perpendicular to the paper surface of FIGS. 9A and 9B. The second contacts 82*e*, 82*f*, 82*g*, and 82*h* can be brought into contact with and separated from the terminals 111, 112, 113, and 114 (see FIG. 7) of the image forming apparatus 100 in conjunction with an operation of attaching and detaching the circuit board unit 80 (toner container 32Y) to and from the image forming apparatus 100.

The relays 82A, 82B, 82C, and 82D relay conduction between the terminals 81*a*, 81*b*, 81*c*, and 81*d*, respectively, of the circuit board 81 and the terminals 111, 112, 113, and 114 in contact with the second contacts 82*e*, 82*f*, 82*g*, and 82*h*, respectively. In other words, in the present embodiment, the terminals 81*a*, 81*b*, 81*c*, and 81*d* of the circuit board 81 and the terminals 111, 112, 113, and 114 are not directly and electrically connected. However, the terminals 81*a*, 81*b*, 81*c*, and 81*d* of the circuit board 81 and the terminals 111, 112, 113, and 114 are electrically connected via the relays 82A, 82B, 82C, and 82D, respectively.

Specifically, as illustrated in FIG. 9C, the ground terminal 81*a* is electrically connected to the shaft-shaped body terminal 111 which is grounded in the image forming apparatus 100 via the first relay 82A. To be specific, the second contact 82*e* of the first relay 82A is an opening opened in the attachment and detachment direction of the circuit board unit 80. The second contact 82*e* is formed so that the shaft-shaped body terminal 111 can be fitted to the second contact 82*e*.

As illustrated in FIG. 9D, the terminal 81*b* for clock signal is electrically connected to the plate-shaped body terminal 112, which is a terminal to which a clock signal is transmitted from the controller 90, via the second relay 82B. To be specific, the second contact 82*f* of the second relay 82B is a planar portion substantially orthogonal to the attachment and detachment direction of the circuit board unit 80.

As illustrated in FIG. 9D, the terminal 81*c* for serial-data communication is electrically connected to the plate-shaped body terminal 113, which is a terminal to which serial data is transmitted from the controller 90, via the third relay 82C. To be specific, the second contact 82*g* of the third relay 82C is a planar portion substantially orthogonal to the attachment and detachment direction of the circuit board unit 80.

As illustrated in FIG. 9D, the terminal 81*d* for power supply is electrically connected to the plate-shaped body terminal 114, which is a terminal to which power is transmitted from the controller 90, via the fourth relay 82D. To be specific, the second contact 82*h* of the fourth relay 82D is a planar portion substantially orthogonal to the attachment and detachment direction of the circuit board unit 80. The second contact 82*e* and the second contacts 82*f*, 82*g*, and 82*h* contacts the terminal 111 and the terminals 112, 113, and 114, respectively, in different directions.

As illustrated in FIGS. 8A, 9A, 9C, and 9D, the casing 83 is made of an insulating material and covers the relays 82A, 82B, 82C, and 82D so that the second contacts 82*e*, 82*f*, 82*g*, and 82*h* are exposed. In other words, the circuit board unit 80 is in a state in which the four second contacts 82*e*, 82*f*, 82*g*, and 82*h* are exposed from the four openings formed in the casing 83 when viewed from a side of the terminal unit 110. The casing 83 is detachably installed on the circuit board 81 in a state in which the relays 82A, 82B, 82C, and 82D are detachably mounted.

To be specific, the relays 82A, 82B, 82C, and 82D are positioned and installed in a groove formed inside from a bottom (opening) of the casing 83 formed in a box shape. Snap-fits are formed at four corners of an edge of the bottom of the casing 83, and the snap-fits are detachably fitted to snap-fit holes 81*x* for the snap fits formed at four corners of the circuit board 81.

As described above, the circuit board unit 80 according to the present embodiment includes the circuit board 81, the casing 83, and the relays 82A, 82B, 82C, and 82D as members that can be disassembled. Thus, maintenance is facilitated.

As described above, in the circuit board unit 80 of the present embodiment, the terminals 81*a*, 81*b*, 81*c*, and 81*d* of the circuit board 81 are not directly connected to the terminals 111, 112, 113, and 114, respectively. However, the relays 82A, 82B, 82C, and 82D are connected to the terminals 111, 112, 113, and 114, respectively. Thus, the terminals 81*a*, 81*b*, 81*c*, and 81*d* are electrically connected to the terminals 111, 112, 113, and 114, respectively via the respective relays 82A, 82B, 82C, and 82D.

Accordingly, as compared with the case in which the terminals 81*a*, 81*b*, 81*c*, and 81*d* are directly connected to the terminals 111, 112, 113, and 114, respectively, a disadvantage that the circuit board 81 itself contacts the terminals 111, 112, 113, and 114 and may be damaged when the toner-container 32Y including the circuit board unit 80 is mounted on the body of the image forming apparatus 100 is restrained. In particular, even when the toner container 32Y including the circuit board unit 80 is repeatedly mounted on and detached from the body of the image forming apparatus 100, such a disadvantage is unlikely to occur. In general, the circuit board 81 as the IC-chip and particularly, the terminals 81a, 81b, 81c, and 81d of the circuit board 81 do not have sufficient mechanical strength against external forces. Accordingly, the configuration according to the present embodiment as described above is useful.

In particular, in the present embodiment, the relays 82A, 82B, 82C, and 82D are formed of plate spring. Accordingly, even if the relays 82A, 82B, 82C, and 82D come into contact with the terminals 111, 112, 113, and 114, respectively, with strong forces when the relays 82A, 82B, 82C, and 82D are attached to the body of the image forming apparatus 100, the relays 82A, 82B, 82C, and 82D function as cushioning members that soften the strong forces. Therefore, the effect of the present disclosure described above is further likely to be exhibited.

The casing 83 is not limited to the one illustrated such as in FIG. 8A. For example, an additional shape can be provided in accordance with the shape of the toner container 32Y including the cap 34Y on which the circuit board unit 80 is set.

First Modification

Figure 10A:
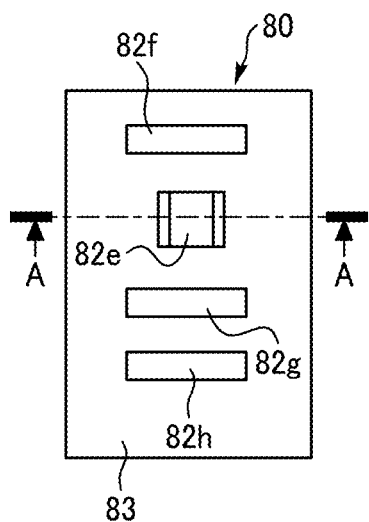
FIG. 10A is a top view of a circuit board unit according to a first modification of the above embodiments of the present disclosure.

FIG. 10A is a top view of the circuit board unit 80 according to a first modification of the above embodiments of the present disclosure.

Figure 10B:
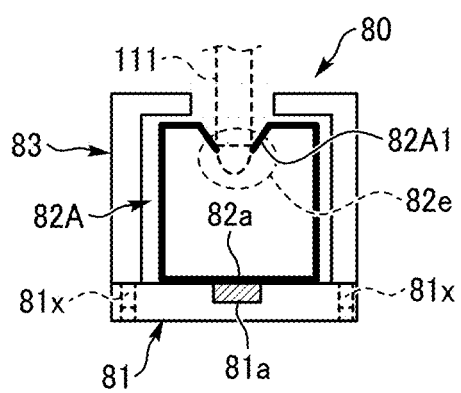
FIG. 10B is an A-A cross-sectional view of a circuit board unit illustrating a cross section A-A of FIG. 10A, according to the first modification of the above embodiments of the present disclosure.

FIG. 10B is an A-A sectional view of the circuit board unit 80 of FIG. 10A according to the first modification of the above embodiments of the present disclosure.

As illustrated in FIGS. 10A and 10B, in the circuit board unit 80 according to the first modification of the above embodiments of the present disclosure, a guide portion 82A1 is formed at an edge of an opening, i.e., the second contact 82e of the first relay 82A.

The guide portion 82A1 guides the shaft-shaped terminal 111 to be fitted into the opening, i.e., the second contact 82e at the time of attachment of the circuit board unit 80. The guide portion 82A1 is elastically deformed when the terminal 111 is fitted into the circuit board unit 80.

Such a configuration described above allows the terminal 111 to be smoothly fitted into the opening, i.e., the second contact 82e when the circuit board unit 80 is attached and the terminal 111 to be brought into close contact with the relay 81A and the opening, i.e., the second contact 82e with relatively strong force. Thus, conduction failure can be prevented.

Second Modification

Figure 11A:
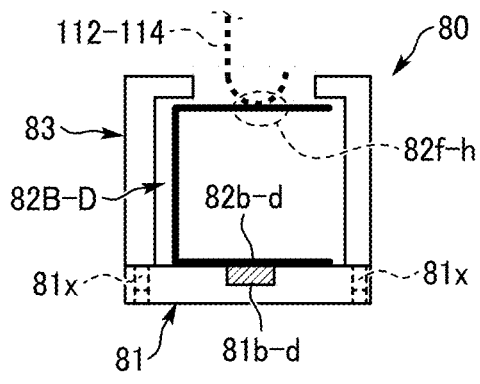
FIGS. 11A and 11B are cross-sectional views of a part of a circuit board unit according to a second modification of the above embodiments of the present disclosure.
Figure 11B:
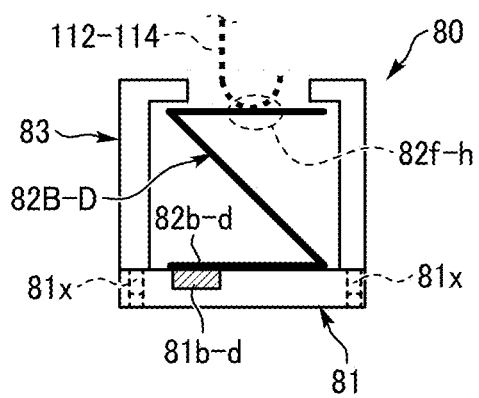

FIGS. 11A and 11B are cross-sectional views of a part of the circuit board unit 80 according to a second modification of the above embodiments of the present disclosure. As illustrated in FIG. 11A, in the circuit board unit 80 according to the second modification of the above embodiments of the present disclosure, the relays 82B, 82C, and 82D are formed in a substantially U-shape.

The relays 82B, 82C, and 82D illustrated in FIG. 11B are formed in a substantially Z shape. Such a configuration described above also allows damage to the circuit board 81 to be reduced. In FIGS. 11A and 11B, the second, third, and fourth relays 82B, 82C, and 82D are illustrated. However, no limitation is indicated thereby, and the first relay 82A can also be formed in a substantially U-shape or a substantially Z-shape in a similar manner to the second, third, and fourth relays 82B, 82C, and 82D. The second contact 82e and the second contacts 82f, 82g, and 82h contacts the terminal 111 and the terminals 112, 113, and 114, respectively, in different directions.

In the second modification of the above embodiments of the present disclosure, in the circuit board unit 80 illustrated in FIG. 11B, the first contacts 82b, 82c, and 82d that contact the terminals 81b, 81c, and 81d, respectively, are not disposed at positions directly below the second contacts 82f, 82g, and 82h, respectively. However, the first contacts 82b, 82c, and 82d are disposed at positions shifted from the positions directly below the second contacts 82f, 82g, and 82h, respectively. As described above, the first contacts 82b, 82c, and 82d that contact the terminals 81b, 81c, and 81d, respectively, are not formed on a same plane on which the second contacts 82f, 82g, and 82h are provided. However, the first contacts 82b, 82c, and 82d may be separated from each other, and the positions of the first contacts 82b, 82c, and 82d can be freely set in accordance with the configuration of the circuit board 81, the layout or shape of the toner container 32Y, the image forming apparatus 100, and the terminal unit 110. In other words, the size of the circuit board 81 can be reduced, the degree of freedom in layout of the circuit board unit 80 can be enhanced, and the cost of the image forming apparatus 100 can be reduced. Accordingly, even if the terminal unit 110 of the image forming apparatus 100 already used by the user is not modified or replaced by a service representative, the toner container 32Y in which a new circuit board unit 80 is installed can be used.

Third Modification

Figure 12A:
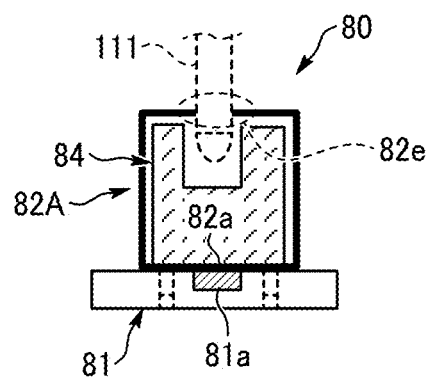
FIGS. 12A and 12B are cross-sectional views of a part of a circuit board unit according to a third modification of the above embodiments of the present disclosure.
Figure 12B:
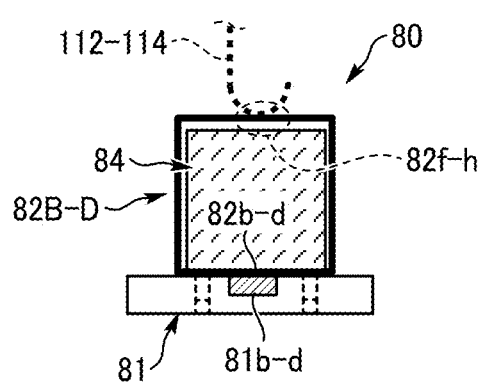

FIGS. 12A and 12B are cross-sectional views of a part of the circuit board unit 80 according to a third modification of the present disclosure.

As illustrated in FIGS. 12A and 12B, the circuit board unit 80 according to the third modification includes a restricting member 84 which is made of an insulating material and is formed so as to be contactable with the relays 82A, 82B, 82C, and 82D.

The restricting member 84 restricts deformation or impact of the relays 82A, 82B, 82C, and 82D due to the terminals 111, 112, 113, and 114 contacting the second contacts 82e, 82f, 82g, and 82h, respectively.

Specifically, the restricting member 84 is disposed inside the relays 82A, 82B, 82C, and 82D (on an inner peripheral surfaces of the relays 82A, 82B, 82C, and 82D). As the restricting member 84, a rigid body disposed so as to face the relays 82A, 82B, 82C, and 82D with a predetermined clearance may be used, or an elastic body such as a cushioning material disposed so as to contact the relays 82A, 82B, 82C, and 82D may also be used. In the former case, when the terminals 111, 112, 113, and 114 contact the second contacts 82e, 82f, 82g, and 82h, respectively, deformation of the relays 82A, 82B, 82C, and 82D may be restricted. Accordingly, damage due to the deformation of the relays 82A, 82B, 82C, and 82D exceeding a limit can be prevented. In addition, in the latter case, when the terminals 111, 112, 113, and 114 contact the second contacts 82e, 82f, 82g, and 82h, respectively, impact on the relays 82A, 82B, 82C, and 82D may be restricted. Accordingly, the impact is less likely to be transmitted to the terminals 81a, 81b, 81c, and 81d and damage to the terminals 81a, 81b, 81c, and 81d due to the impact can be reduced.

In the third modification of the above embodiments of the present disclosure, the restricting member 84 is detachably installed on the circuit board 81 in a state in which the relays 82A, 82B, 82C, and 82D are detachably installed.

Specifically, the relays 82A, 82B, 82C, and 82D are positioned and installed on a convex portion formed on an outer peripheral surface of the restricting member 84 formed in a substantially rectangular parallelepiped shape. Snap-fits are formed at four corners of a bottom portion of the restricting member 84. The snap-fits are detachably fitted to the snap-fit holes 81x formed at four corners of the circuit board 81.

As described above, the circuit board unit 80 according to the present embodiment includes the circuit board 81, the restricting member 84, and the relays 82A, 82B, 82C, and 82D so as to be disassembled. Thus, maintenance is facilitated.

The restricting member 84 is not limited to those illustrated in FIGS. 12A and 12B. For example, the restricting member 84 may be formed in an additional shape in accordance with the shape of the cap 34Y of the toner container 32Y on which the circuit board unit 80 is set. In addition, the restricting member 84 and the casing 83 illustrated in, for example, FIGS. 8A and 8B can be installed together in the circuit board unit 80.

Fourth Modification

Figure 13A:
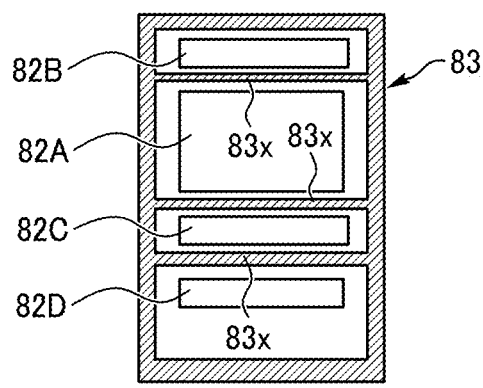
FIGS. 13A and 13B are cross-sectional views of a circuit board unit illustrating a cross section parallel to a circuit board, according to a fourth modification of the above embodiments of the present disclosure.
Figure 13B:
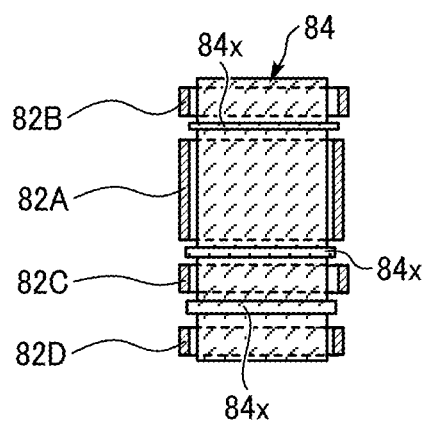

FIGS. 13A and 13B are cross-sectional views of the circuit board unit 80 parallel to the circuit board 81 according to a fourth modification of the above embodiments of the present disclosure.

As illustrated in FIG. 13A, the circuit board unit 80 according to the fourth modification of the above embodiments of the present disclosure includes partitions 83x inside the casing 83. The partitions 83x partition adjacent ones of the relays 82A, 82B, 82C, and 82D.

In addition, in the circuit board unit 80 illustrated in FIG. 13B, the restricting member 84 includes partitions 84x that partition adjacent ones of the relays 82A, 82B, 82C, and 82D. Providing the partitions 83x and 84x as described above allows the adjacent ones of the relays 82A, 82B, 82C, and 82D to prevent from contacting each other and are electrically connected to each other.

Fifth Modification

Figure 14A:
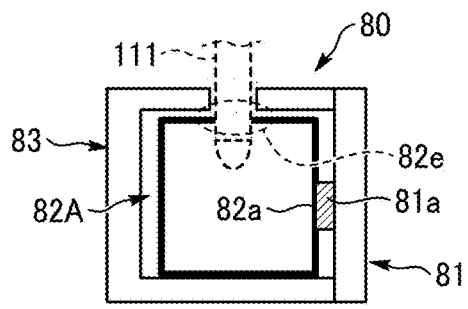
FIGS. 14A and 14B are cross-sectional views of a part of a circuit board unit according to a fifth modification of the above embodiments of the present disclosure.
Figure 14B:
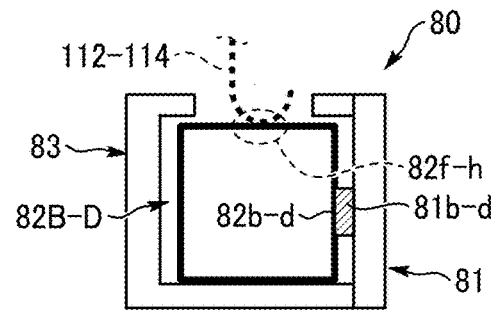

FIGS. 14A and 14B are cross-sectional views of a part of the circuit board unit 80 according to a fifth modification of the above embodiments of the present disclosure.

As illustrated in FIGS. 14A and 14B, in the circuit board unit 80 according to the fifth modification, the relays 82A, 82B, 82C, and 82D includes the second contacts 82e, 82f, 82g, and 82h that are disposed at positions at which are separated from the first contacts 82a, 82b, 82c, and 82d, respectively, in a direction substantially orthogonal to the attachment and detachment direction of the circuit board unit 80 as a predetermined direction (a left-right direction in FIGS. 14A and 14B).

In other words, the second contacts 82e, 82f, 82g, and 82h are disposed on upper surfaces of the relays 82A, 82B, 82C, and 82D, respectively, in FIGS. 14A and 14B, and the first contacts 82a, 82b, 82c, and 82d are disposed on side surfaces of the relays 82A, 82B, 82C, and 82D, respectively. Also, in the case of such a configuration, a disadvantage of the circuit board 81 coming into contact with the terminals 111, 112, 113, and 114 and being damaged is restrained.

In particular, adopting the configuration of the fifth modification of the above embodiments of the present disclosure allows the degree of freedom of the layout of the circuit board 81 and the terminals 111, 112, 113, and 114 to be enhanced.

Sixth Modification

Figure 15A:
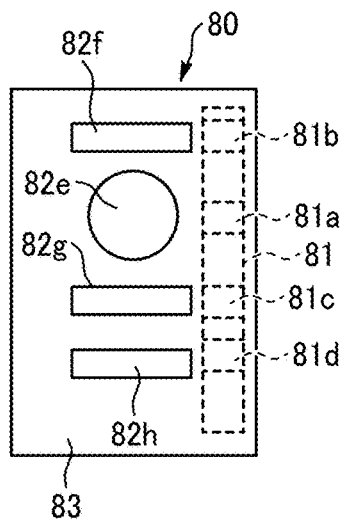
FIGS. 15A and 15B are views of a part of a circuit board unit projected in an attachment and detachment direction, according to a sixth modification of the above embodiments of the present disclosure.
Figure 15B:
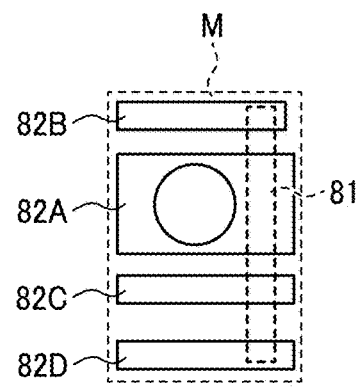

FIGS. 15A and 15B are views of a part of the circuit board unit 80 projected in an attachment and detachment direction of the circuit board unit 80 according to a sixth modification of the above embodiments of the present disclosure.

As illustrated in FIG. 15A, the circuit board unit 80 according to the sixth modification of the above embodiments of the present disclosure is formed such that the second contacts 82e, 82f, 82g, and 82h do not overlap with the circuit board 81 when projected in the attachment and detachment direction of the circuit board unit 80 or the toner container 32Y as a predetermined direction.

In the circuit board unit 80 illustrated in FIG. 15B, the circuit board 81 is disposed in the plane of the relays 82A, 82B, 82C, and 82D on which the second contacts 82e, 82f, 82g, and 82h, respectively, are formed, when viewed from the attachment and detachment direction of the circuit board unit 80 and the toner container 32Y as a predetermined direction. In other words, the circuit board 81 is disposed within a range M occupied by the four relays 82A, 82B, 82C, and 82D illustrated in FIG. 15B.

Specifically, in the circuit board unit 80 illustrated in both FIG. 15A and FIG. 15B, the second contacts 82e, 82f, 82g, and 82h and the terminals 81a, 81b, 81c, and 81d that serve as the first contacts 82a, 82b, 82c, and 82d are arranged so as not to overlap each other, respectively, when viewed from the attachment and detachment direction of the circuit board unit 80.

Such a configuration described above allow the circuit board unit 80 including the circuit board 81 to be reduced in size. In addition, the layout and the shape of the circuit board unit 80 can be freely designed in accordance with the layout and shape of the toner container 32Y, the body of the image forming apparatus 100, and the terminal unit 110. In other words, the size of the circuit board 81 can be reduced, the degree of freedom in layout of the circuit board unit 80 can be enhanced, and the cost of the image forming apparatus 100 can be reduced. Accordingly, even if modification or replacement of the terminal unit 110 of the image forming apparatus 100 already used by the user is not performed by a service representative, the toner container 32Y in which the new circuit board unit 80 is installed can be used.

Seventh Modification

Figure 16:
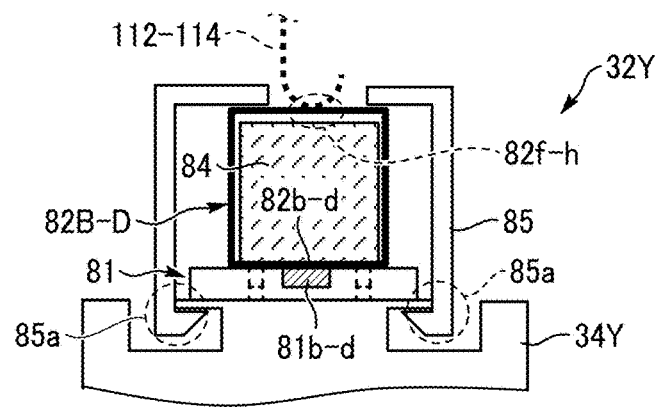
FIG. 16 is a cross-sectional view of a part of a circuit board unit according to a seventh modification of the above embodiments of the present disclosure.

FIG. 16 is a cross-sectional view of a part of the circuit board unit 80 according to a seventh modification of the above embodiments of the present disclosure.

As illustrated in FIG. 16, the toner container 32Y, which is an attachment unit, according to the seventh modification of the above embodiments of the present disclosure includes a holder 85. The holder 85 holds the circuit board 81 and the relays 82A, 82B, 82C, and 82D onto the cap 34Y in a state in which the first contacts 82a, 82b, 82c, and 82d of the respective relays 82A, 82B, 82C, and 82D are in contact with the terminals 81a, 81b, 81c, and 81d, respectively.

Specifically, the holder 85 is fitted to the cap 34Y by the snap-fits 85a so as to cover the circuit board 81 and the relays 82A, 82B, 82C, and 82D of which the first contacts 82a, 82b, 82c, and 82d are in contact with the terminals 81a, 81b, 81c, and 81d, respectively. Such a configuration as described above allows the circuit board 81 and the relays 82A, 82B, 82C, and 82D to be positioned on the cap 34Y of the toner container 32Y in a state in which the circuit board 81 and the relays 82A, 82B, 82C, and 82D are in a conductive state.

Adopting such a configuration as described above allows the circuit board 81 and the first contacts 82a, 82b, 82c, and 82d to be disassembled only by removing the holder 85 from the cap 34Y. Thus, maintenance is facilitated. Even in such a configuration, attaching the circuit board unit 80 to the body of the image forming apparatus 100 can reduce damage to the circuit board 81.

According to the seventh modification of the above embodiments of the present disclosure, the restricting member 84 is provided inside the relays 82A, 82B, 82C, and 82D. However, the restricting member 84 may be omitted.

Eighth Modification

Figure 17A:
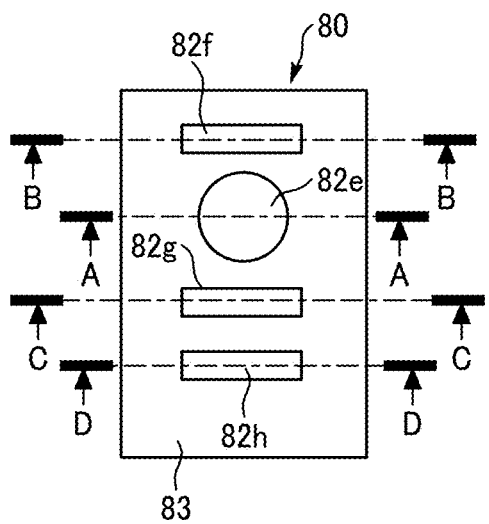
FIG. 17A is a top view of a circuit board unit according to an eighth modification of the above embodiments of the present disclosure.

FIG. 17A is a top view of the circuit board unit 80 according to an eighth modification of the above embodiments of the present disclosure.

Figure 17B:
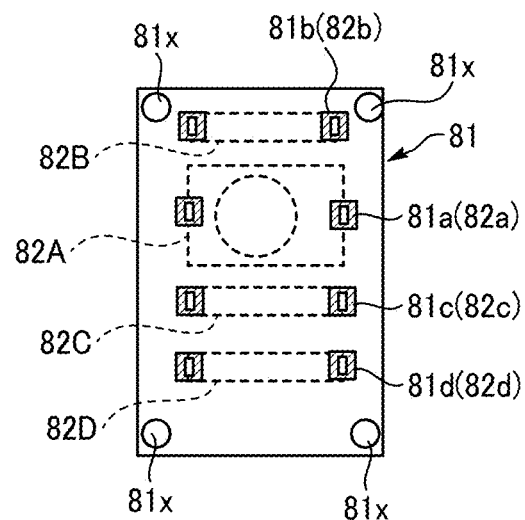
FIG. 17B is a top view of a circuit board of a circuit board unit, according to the eighth modification of the above embodiments of the present disclosure.

FIG. 17B is a top view of the circuit board 81 of the circuit board unit 80 according to the eighth modification of the above embodiments of the present disclosure.

Figure 17C:
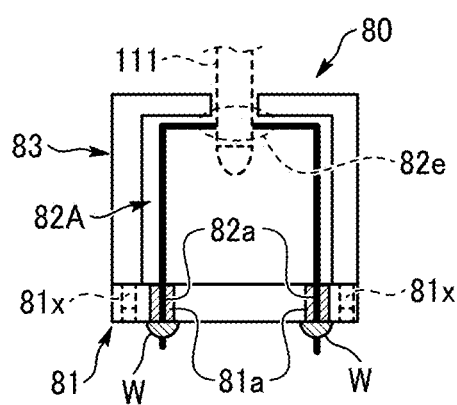
FIG. 17C is an A-A cross-sectional of the circuit board unit of FIG. 17A, according to the eighth modification of the above embodiments of the present disclosure.

FIG. 17C is an A-A cross-sectional of the circuit board unit 80 of FIG. 9A according to the eighth modification of the above embodiments of the present disclosure.

Figure 17D:
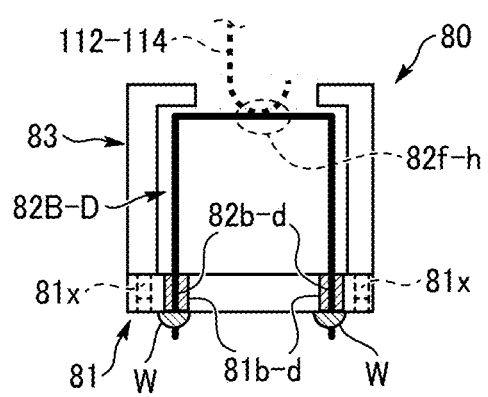
FIG. 17D is a B-B sectional view, C-C sectional view, and D-D sectional view of the circuit board unit of FIG. 17A, according to the eighth modification of the above embodiments of the present disclosure.

FIG. 17D is a B-B sectional view, a C-C sectional view, or a D-D sectional view of the circuit board unit 80 of FIG. 9A according to the eighth modification of the above embodiments of the present disclosure.

As illustrated in FIGS. 17A, 17B, 17C, and 17D, in the circuit board unit 80 according to the eighth modification of the above embodiments of the present disclosure, the relays 82A, 82B, 82C, and 82D are fitted into fitting holes formed in the terminals 81a, 81b, 81c, and 81d, respectively, of the circuit board 81 to electrically connect the relays 82A, 82B, 82C, and 82D to the terminals 81a, 81b, 81c, and 81d, respectively. In such a case, the first contacts 82a, 82b, 82c, and 82d of the respective relays 82A, 82B, 82C, and 82D that contact the terminals 81a, 81b, 81c, and 81d, respectively, fit into the fitting holes of the terminals 81a, 81b, 81c, and 81d, respectively. The first contacts 82a, 82b, 82c, and 82d of the respective relays 82A, 82B, 82C, and 82D to be fitted into the fitting holes of the terminals 81a, 81b, 81c, and 81d, respectively, are formed so as to be fittable in accordance with the size and shape of the fitting holes, which have a rectangular shape in the eighth modification of the above embodiments of the present disclosure, of the terminals 81a, 81b, 81c, and 81d.

In the eighth modification of the above embodiments of the present disclosure, as illustrated in FIGS. 17C and 17D, distal ends as lower ends of the relays 82A, 82B, 82C, and 82D penetrate through the fitting holes of the respective terminals 81a, 81b, 81c, and 81d and protrude to the back surface, which is the lower surface in FIGS. 17C and 17D, of the circuit board 81. The portions W of the relays 82A, 82B, 82C, and 82D protruding from the back surface of the circuit board 81 are fixed to the circuit board 81 by soldering.

Such a configuration as described above also prevents the circuit board 81 from contacting the terminals 111, 112, 113, and 114. Thus, damage to the circuit board 81 can be reduced.

As described above, the circuit board unit 80 according to the present embodiment is detachably attached in a predetermined direction, which is the attachment and detachment direction of the circuit board unit 80 with respect to the body of the image forming apparatus 100. The circuit board unit 80 includes the circuit board 81 and the relays 82A, 82B, 82C, and 82D. The circuit board 81 is disposed so that the terminals 81a, 81b, 81c, and 81d are exposed and the relays 82A, 82B, 82C, and 82D contact the terminals 81a, 81b, 81c, and 81d, respectively, in a conductive manner. In addition, the relays 82A, 82B, 82C, and 82D include the second contacts 82e, 82f, 82g, and 82h, respectively. The second contacts 82e, 82f, 82g, and 82h are disposed at positions separated from the respective first contacts 82a, 82b, 82c, and 82d that contact the terminals 81a, 81b, 81c, and 81d, respectively. The second contacts 82e, 82f, 82g, and 82h can contact and separate from the terminals 111, 112, 113, and 114, respectively, of the body of the image forming apparatus 100 in conjunction with the attachment and detachment operation of the circuit board unit 80 with respect to the body of the image forming apparatus 100. The relays 82A, 82B, 82C, and 82D relay conduction between the terminals 81a, 81b, 81c, and 81d and the respective terminals 111, 112, 113, and 114 in contact with the respective second contacts 82e, 82f, 82g, and 82h.

Accordingly, even when the circuit board 81 is attached to the body of the image forming apparatus 100, damage to the circuit board 81 is unlikely to occur.

In the present embodiment, the above embodiments of the present disclosure are applied to the circuit board unit 80 installed in the toner container 32Y, 32M, 32C, and 32K as the toner container in which toner is stored. However, no limitation is indicated thereby, and the above embodiments of the present disclosure can also be applied to the circuit board unit 80 installed in a toner container in which toner is stored, such as an ink cartridge removably mounted on an inkjet image forming apparatus. Further, the present disclosure can be applied not only to storage containers such as the toner containers 32Y, 32M, 32C, 32K in which toner and ink are stored. However, the present disclosure can also be applied to all circuit board units such as the circuit board unit 80 mounted on an attachment unit, for example, the developing device 5Y or a process cartridge, detachably mounted on the body of an image forming apparatus.

An IC chip is used as the circuit board 81 in the present embodiment. However, the circuit board 81 is not limited to the IC chip and is not limited to a circuit board that stores information. For example, an ID chip, a radiofrequency identification (RFID), a printed circuit board, an IC tag, or the like can be used as the circuit board 81.

In the present embodiment, the above embodiments of the present disclosure are applied to the circuit board unit 80 in which the four terminals including the terminal 81a for clock signal, the terminal 81b for grounding, the terminal 81c for serial-data, and the terminal 81d for power supply are provided on the circuit board 81. However, the circuit board unit 80 to which the above embodiments of the present disclosure are applied is not limited to such a configuration. For example, the present disclosure can be applied to a circuit board unit provided with a circuit board including at least four terminals, a terminal for clock signal, a terminal for grounding, a terminal for serial data, and a terminal for power supply. Further, the above embodiments of the present disclosure can also be applied to a circuit board unit having a substrate provided with three or less terminals.

In the present embodiment, all of the terminals 81a, 81b, 81c, and 81d are electrically connected to the respective terminals 111, 112, 113, and 114 via the relays 82A, 82B, 82C, and 82D, respectively. However, some of the terminals 81a, 81b, 81c, and 81d (for example, only the first terminal

81*a* for grounding) may be electrically connected to the respective terminals 111, 112, 113, and 114 via the relay 82, and the other terminals may be directly connected to the respective terminals 111, 112, 113, and 114. Such a configuration is useful, for example, in a case in which only a part of the terminals is likely to be damaged if the part of the terminals directly contacts the terminals 111, 112, 113, and 114.

In addition, in the present embodiment, the relays 82A, 82B, 82C, and 82D are formed of a metallic material (conductive material). However, the relays 82A, 82B, 82C, and 82D only need to be electrically connected between the first contacts 82*a*, 82*b*, 82*c*, and 82*d* and the second contacts 82*e*, 82*f*, 82*g*, and 82*h*, respectively. Accordingly, relays having a surface covered with an insulative material except at the first contacts 82*a*, 82*b*, 82*c*, and 82*d* and the second contacts 82*e*, 82*f*, 82*g*, and 82*h* may be used.

Even in such cases as described above, the same effects as those of the present embodiment can be obtained.

Note that the above-described embodiments are illustrative and do not limit the present disclosure. It is therefore to be understood that within the scope of the present disclosure, the present disclosure may be practiced otherwise than as specifically described herein. Further, the number, position, and shape of the components described above are not limited to those embodiments described above. Desirable number, position, and shape can be determined to perform the present disclosure.

In the above descriptions, the term "printing" in the present disclosure may be used synonymously with, e.g., the terms of "image formation", "recording", "printing", and "image printing".

What is claimed is:

1. A circuit board unit comprising:
a circuit board including an exposed terminal; and
a relay contacting the exposed terminal in a conductive manner,
wherein the relay includes:
a first contact contacting the exposed terminal; and
a second contact disposed at a position away from the first contact and to contact and separate from a terminal of an apparatus in conjunction with attachment and detachment of the circuit board unit to and from a body of the apparatus,
wherein the relay is to relay conduction between the exposed terminal and the terminal of the apparatus,
wherein the circuit board unit includes:
a plurality of terminals including the exposed terminal;
a plurality of relays including the relay; and
a plurality of second contacts including the second contact,
wherein each one of the plurality of relays contacts one of the plurality of terminals including the exposed terminal in a conductive manner, and
wherein one of the plurality of second contacts is to contact one of a plurality of apparatus terminals which includes the terminal of the apparatus in a different direction in which another of the plurality of second contacts is to contact another of the plurality of apparatus terminals.

2. The circuit board unit according to claim 1,
wherein one of the plurality of second contacts is disposed at the position away from the first contact in a predetermined direction in which the circuit board unit is attached to or detached from the body of the apparatus or in a direction substantially orthogonal to the predetermined direction.

3. The circuit board unit according to claim 1,
wherein the circuit board is an integrated circuit chip including a memory to communicate information with the apparatus, and
wherein the plurality of terminals including the exposed terminal includes at least four terminals including a terminal for a clock signal, a terminal for grounding, a terminal for serial data, and a terminal for power supply.

4. The circuit board unit according to claim 1, further comprising a casing made of an insulating material and to cover the relay in a state in which the second contact is exposed.

5. The circuit board unit according to claim 1,
wherein the relay includes:
the one of the plurality of second contacts configured to contact one of the plurality of terminals of the apparatus in the different direction; and
a guide portion to guide fitting of the one of the plurality of terminals.

6. The circuit board unit according to claim 1,
wherein the another of the plurality of second contacts is a planar portion substantially orthogonal to a predetermined direction in which the circuit board unit is attached to or detached from the body of the apparatus.

7. The circuit board unit according to claim 1,
wherein the one of the plurality of second contacts includes an opening opened in a predetermined direction in which the circuit board unit is attached to or detached from the body of the apparatus, and
wherein the one of the plurality of second contacts is to fit with the one of the plurality of terminals including a terminal of the terminals of the apparatus which has a shaft shape.

8. The circuit board unit according to claim 1,
wherein the relay includes a bent plate spring made of a metallic material.

9. The circuit board unit according to claim 1,
wherein the circuit board is disposed in a plane of the relay on which the second contact is disposed, when projected in a predetermined direction in which the circuit board unit is attached to or detached from the body of the apparatus.

10. An attachment unit to be detachably installed in an image forming apparatus, the attachment unit comprising the circuit board unit according to claim 1.

11. The attachment unit according to claim 10,
wherein the attachment unit is a container in which toner or ink is stored.

12. A circuit board unit comprising:
a circuit board including an exposed terminal; and
a relay contacting the exposed terminal in a conductive manner,
wherein the relay includes:
a first contact contacting the exposed terminal; and
a second contact disposed at a position away from the first contact and to contact and separate from a terminal of an apparatus in conjunction with attachment and detachment of the circuit board unit to and from a body of the apparatus,
wherein the relay is to relay conduction between the exposed terminal and the terminal that contacts the second contact,
wherein the circuit board unit further comprises a casing made of an insulating material and to cover the relay in a state in which the second contact is exposed, and wherein the casing is detachably installed on the circuit board in a state in which the relay is installed on the circuit board.

13. A circuit board unit comprising:
a circuit board including an exposed terminal; and
a relay contacting the exposed terminal in a conductive manner,
wherein the relay includes:
a first contact contacting the exposed terminal;
a second contact disposed at a position away from the first contact and to contact and separate from a terminal of an apparatus in conjunction with attachment and detachment of the circuit board unit to and from a body of the apparatus,
wherein the relay is to relay conduction between the exposed terminal and the terminal that contacts the second contact,
wherein the circuit board unit further comprises a casing made of an insulating material and to cover the relay in a state in which the second contact is exposed,
wherein the circuit board unit includes:
a plurality of terminals including the exposed terminal; and
a plurality of relays including the relay,
wherein the plurality of relays contact the plurality of terminals including the exposed terminal in a conductive manner, and
wherein the casing includes a partition partitioning adjacent ones of the plurality of relays,
wherein one of the plurality of relays and another of the plurality of relays excluding the one of the plurality of relays are configured to contact a different corresponding terminal of the plurality of terminals of the apparatus in different directions.

14. An attachment unit to be detachably installed in an image forming apparatus, the attachment unit comprising the circuit board unit according to claim 13.

15. A circuit board unit comprising:
a circuit board including an exposed terminal; and
a relay contacting the exposed terminal in a conductive manner,
wherein the relay includes:
a first contact contacting the exposed terminal; and
a second contact disposed at a position away from the first contact and to contact and separate from a terminal of an apparatus in conjunction with attachment and detachment of the circuit board unit to and from a body of the apparatus, the second contact having a flat portion which is in a plane perpendicular to a direction of relative movement between the second contact the terminal of the apparatus,
wherein the relay is to relay conduction between the exposed terminal and the terminal of the apparatus that contacts the second contact,
wherein the circuit board unit further comprises:
a restrictor made of an insulating material and to be contactable with the relay,
wherein the restrictor is to restrict deformation or impact of the relay due to the terminal contacting the second contact.

16. The circuit board unit according to claim 15,
wherein the restrictor is detachably installed on the circuit board in a state in which the restrictor is installed on the relay.

17. The circuit board unit according to claim 15,
wherein the circuit board includes:
a plurality of terminals including the exposed terminal; and
a plurality of relays including the relay,
wherein the plurality of relays contact the plurality of terminals including the exposed terminal in a conductive manner, and
wherein the restrictor includes a partition partitioning adjacent ones of the plurality of relays.

18. A circuit board unit comprising:
a circuit board including an exposed terminal; and
a relay contacting the exposed terminal in a conductive manner,
wherein the relay includes:
a first contact contacting the exposed terminal; and
a second contact disposed at a position away from the first contact and to contact and separate from a terminal of an apparatus in conjunction with attachment and detachment of the circuit board unit to and from a body of the apparatus,
wherein the relay is to relay conduction between the exposed terminal and the terminal that contacts the second contact,
wherein the second contact does not overlap with the circuit board when projected in a predetermined direction in which the circuit board unit is attached to or detached from the body of the apparatus.

19. An attachment unit to be detachably installed in an image forming apparatus, the attachment unit comprising the circuit board unit according to claim 18.

* * * * *